United States Patent [19]
Logan et al.

[11] 3,978,426
[45] Aug. 31, 1976

[54] HETEROSTRUCTURE DEVICES INCLUDING TAPERED OPTICAL COUPLERS

[75] Inventors: Ralph Andre Logan; James Logan Merz, both of Morristown; Franz Karl Reinhart, Summit; Harry Gregory White, Bernardsville, all of N.J.

[73] Assignee: Bell Telephone Laboratories, Incorporated, Murray Hill, N.J.

[22] Filed: Mar. 11, 1975

[21] Appl. No.: 557,250

[52] U.S. Cl. ............................ 331/94.5 H; 357/16; 357/18
[51] Int. Cl.² ......................................... H01S 3/19
[58] Field of Search ................ 331/94.5 H; 357/16, 357/17, 18; 350/96 WG; 250/552

[56] References Cited
UNITED STATES PATENTS

| | | | |
|---|---|---|---|
| 3,428,845 | 2/1969 | Nelson | 357/18 X |
| 3,576,501 | 4/1971 | Deutsch | 331/94.5 H |
| 3,636,358 | 1/1972 | Groschwitz | 250/552 X |
| 3,883,888 | 5/1975 | Kressel et al. | 357/16 |
| 3,897,135 | 7/1975 | Dyott | 331/94.5 H X |

OTHER PUBLICATIONS

Tien et al., *Formation of Light–Guiding Interconnections,* Applied Optics, vol. 12, No. 8, 1973 pp. 1909–1916.
Tien et al., *Two–Layered Construction of Integrated Optical Circuits,* Applied Physics Letters, vol. 24, No. 11, 1974 pp. 547–549.
Reinhart, *Monolithically Integrated AlGaAs Double Heterostructure Optical Components,* Appl. Phys. Let., vol. 25, No. 10, 1974 pp. 622–624.

*Primary Examiner*—Eugene La Roche
*Attorney, Agent, or Firm*—M. J. Urbano

[57] ABSTRACT

Described is a double heterostructure junction laser in which the active region tapers to zero thickness within the structure, causing light to couple into an adjacent, underlying passive waveguide layer. Also described is a laser device in which the passive waveguide layer terminates in a region of increased thickness adjacent a laser output face. In addition, LPE and MBE techniques for fabricating the tapers are described.

8 Claims, 5 Drawing Figures

HETEROSTRUCTURE DEVICES INCLUDING TAPERED OPTICAL COUPLERS

BACKGROUND OF THE INVENTION

This invention relates to heterostructure semiconductor optical devices including tapered couplers and methods of fabricating same.

An important step for the development of monolithic integrated optical circuit components is the efficient transfer of light from one waveguide layer to another so that various circuit components, such as lasers, modulators and detectors, can be optically interconnected. One method to accomplish this transfer, utilizing tapered couplers, has been suggested by Tien et al, and their feasibility in organosilicon film waveguides has been demonstrated (see, *Applied Optics*, Vol. 12, p. 1909 (1973) and *Applied Physics Letters*, Vol. 24, p. 547 (1974)). In AlGaAs waveguides, this transfer has been effected between a passive waveguide of increased bandgap and width which is in tandem with the active layer of a double heterostructure (DH) junction laser or detector with a reduced bandgap. (See, copending application Ser. No. 481,244, Logan-Reinhart Case 24-5, filed on June 20, 1974).

SUMMARY OF THE INVENTION

In accordance with an illustrative embodiment of our invention, in a double heterostructure junction laser the active region tapers to zero thickness within the structure. The taper extends in the direction of light propagation, causing the radiation generated in the active region to couple into an adjacent, underlying or overlying passive waveguide layer. These devices, when fabricated from the GaAs-AlGaAs system, have exhibited high taper coupling efficiencies and low lasing threshold current densities. An advantage of this type of DH laser is that radiation generated in a GaAs active region, for example, is efficiently coupled into a higher bandgap, and hence lower loss, AlGaAs waveguide layer. Transmission and modulation in an integrated circuit, therefore, occurs in the low loss layer and, if desired, the radiation can at various points in the circuit be coupled back into a GaAs layer, for example, for detection or amplification.

Another feature of our invention is that the tapered active region can be terminated short of the laser mirrors, thereby protecting the sensitive active region from contamination by the ambient. The need for passivation is therefore reduced.

In accordance with another embodiment of our invention, the taper in the active region is produced by a thin mask at the bottom of one of the wells of an LPE boatslider apparatus. The mask is closely spaced to the substrate and prevents portions of the growth solution directly above the mask from contacting the substrate. The laterally adjacent portions of melt do contact the substrate and product growth of a layer which has a zone of uniform thickness contiguous with a tapered zone which decreases to zero thickness adjacent to the edges of the mask. The length of the tapers are about 100$\mu$m, whereas the uniformly thick zone may be only 0.5$\mu$m thick. Taper coupling efficiencies of more than 70 percent from a tapered GaAs layer into an underlying $Al_{0.15}Ga_{0.85}As$ layer have been achieved. The tapered layers were grown using a sapphire mask.

BRIEF DESCRIPTION OF THE DRAWING

Our invention, together with its various features and advantages, can be readily understood from the following more detailed description taken in conjunction with the accompanying drawing, in which.

DETAILED DESCRIPTION

Structure

Figure 1:
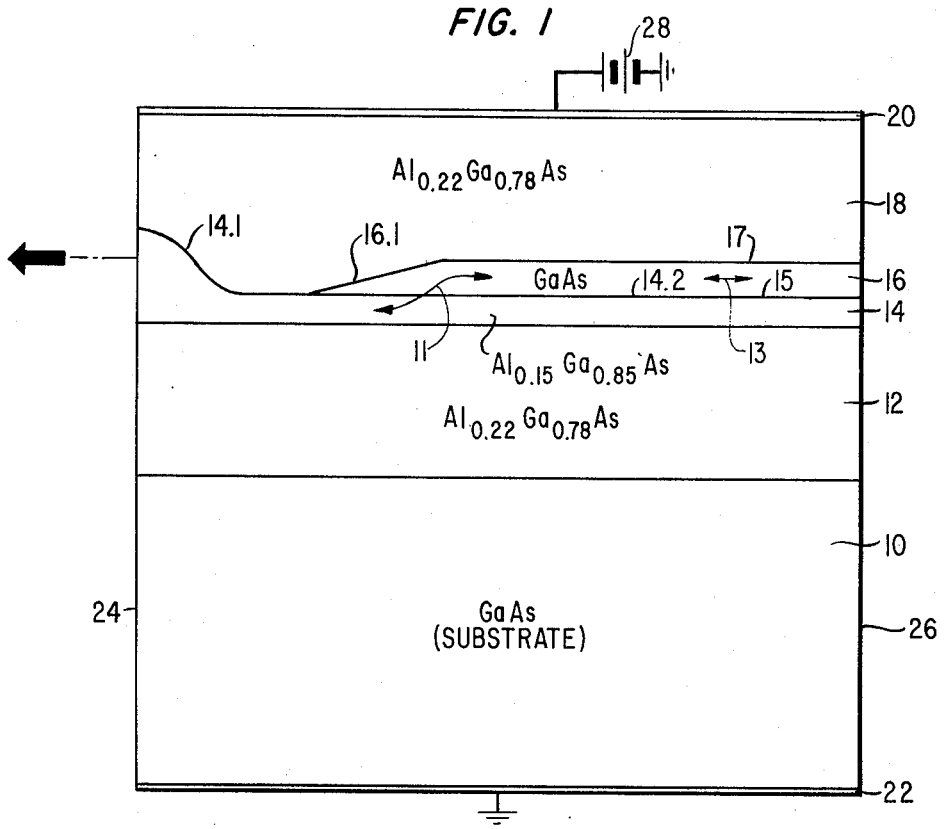
FIG. 1 is a schematic side view of a DH laser having a single taper in the active region in accordance with one embodiment of our invention.

Turning now to FIG. 1, there is shown an illustrative embodiment of our invention, a DH laser comprising, in general, a substrate 10 on which the following layers are epitaxially grown in the order recited: a first wide bandgap layer 12, a passive waveguide layer 14, a narrow bandgap active region 16, and a second wide bandgap layer 18. The bandgap of the passive waveguide layer 14 is less than that of wide bandgap layers 12 and 18 and the bandgap of active region 16 is less than that of layers 14 and 18. Generally, passive waveguide layer 14 and active region 16 are of the same conductivity type whereas wide bandgap layers 12 and 18 are of opposite conductivity types.

A p-n junction is formed in the layer structure by first growing layers of the same conductivity type as the substrate and then growing layers of the opposite conductivity type in the sequence of layer growth. For example, after growth of the active region 16, which is the same conductivity type as the preceding layers 12 and 14 and the substrate, layer 18 is grown with the opposite conductivity type causing the formation of a p-n junction between layer 18 and the regions of layers 14 and 16 that are contacted by 18.

In accordance with one feature of our invention, active region 16 terminates within the structure in a smooth taper 16.1. The taper 16.1 gradually decreases to zero thickness along the direction of radiation propagation (arrow 13).

Ohmic electrical contacts 20 and 22 are formed respectively on layer 18 and substrate 10. Cleaved parallel surfaces 24 and 26 form the mirrors of the laser resonator. When suitably forward biased above the lasing threshold, as by battery 28 connected across contacts 20 and 22, stimulated emission of radiation takes place in the active region 16. For C.W. operation at room temperature, the thickness of active region 16 is preferably between $\lambda/2$ and 1.0$\mu$m, where $\lambda$ is the wavelength of the radiation as measured in the active region. This radiation is coupled (arrow 11) from active region 16 via taper 16.1 into the underlying passive waveguide layer 14. Because the layer 14 has a higher bandgap than active region 16, the coupled radiation will undergo little transmission loss. Reducing optical losses in this manner can be particularly significant where the coupled radiation is to be transmitted over long distances or where it is to be operated upon (e.g., modulated) in the waveguide layer 14.

In order to reduce beam divergence and power density at surface 24, the passive waveguide layer 14 may be provided with a zone 14.1 of increased thickness adjacent to the cleaved output surface 24. The manner in which such a zone is fabricated is described in the copending application of Logan and Reinhart, Case 24-5 supra. Moreover, surface 26 may be provided with a reflection coating (not shown) and/or surface 24 may be provided with an anti-reflection coating (not shown) in order to enhance emission through surface 24.

In an illustrative embodiment, the DH laser of FIG. 1 is fabricated from the GaAs-AlGaAs system. That is, substrate 10 comprises n-GaAs; layers 12 and 14 comprise $Al_xGa_{1-x}R$ and $Al_yGa_{1-y}R$, $y < x$, respectively, where R includes at least As and may also include P; active region 16 comprises $Al_zGa_{1-z}R$, $0 \leq z < y$; and layer 18 comprises $Al_rGa_{1-r}R$, $r > z$ and $y$. Typically substrate 10 and layers 12 and 14 are n-type, layer 18 is p-type and active region may be either n-type, p-type or both (as where a p-n junction is located within the active region). In this case, contact 20 typically includes a $p^+$-GaAs layer formed on $Al_rGa_{1-r}R$ layer 18 to facilitate making good electrical contact thereto.

In general, the materials used to fabricate the layers should provide close lattice matching in order to reduce the likelihood that defects (nonradiative recombination centers) will form in the active region 16 or at the heterojunctions 15 and 17. In this regard, the layers advantageously comprise AlGaAsP as described in copending applications Ser. No. 463,871 (Panish-Rozgonyi 11-6) and Ser. No. 463,870 (Petroff-Rozgonyi 2-7) concurrently filed with one another on Apr. 25, 1974.

EXAMPLE

Using LPE apparatus and techniques described hereinafter, we fabricated a DH laser of the type shown in FIG. 1 comprising the following: a GaAs (100) oriented substrate doped n-type to about $2\times10^{18}/cm^3$; a layer 12 of $Al_{0.22}Ga_{0.78}As$ about 3.3μm thick and doped n-type with Sn to about $3\times10^{17}/cm^3$; a layer 14 of $Al_{0.15}Ga_{0.85}As$ about 0.4μm thick and doped n-type with Sn to about $10^{17}/cm^3$; a layer (active region 16) of GaAs about 0.5μm thick and unintentionally doped n-type to about $10^{16}/cm^3$; and a layer 18 of $Al_{0.22}Ga_{0.78}As$ about 2.8μm thick doped p-type with Ge to about $3\times10^{17}/cm^3$. A conventional contacting layer (not shown) of $p^+$GaAs including a Zn skin diffusion was formed on layer 18. Contacts 20 and 22 were made of Au and Sn, respectively.

In this example, the taper 16.1 decreased smoothly to zero thickness in about 100μm and the zone 14.1 was also about 100μm long.

In order to make measurements, we cut (cleaved) from a single wafer both control lasers from uniform sections (those without zone 14.1 and taper 16.1) as well as taper coupled lasers (TCLs) of the type shown in FIG. 1.

All measurements were made at room temperature with excitation by 100 ns current pulses. Typical control lasers had active region thicknesses of about 0.5μm and cavity lengths of about 0.5mm. For these control lasers the threshold current density was $j_{th} \simeq 2.6$ kA/cm² and the differential quantum efficiencies was $\eta_d \simeq 38\%$ with approximately 80% of the mirror illuminated when lasing. The corresponding values for shorter control lasers with cavity lengths of about 0.25mm were $j_{th} = 3$ kA/cm² and $\eta_d \simeq 43\%$ with 60% of the mirror illuminated when lasing. From this data we deduced an internal quantum efficiency $\eta_i \simeq 80 \pm 20\%$ with a typical loss constant $\alpha$ 16 cm$^{-1}$.

Taper coupled lasers, on the other hand, had typical active region lengths of about 0.6mm and thicknesses of about 0.5μm. This resulted in $j_{th} \simeq 2.6$ kA/cm² and $\eta_d \simeq 28\%$ with typically 60% of the mirror illuminated in the lasing state. Assuming no loss in the zone 14.1 of the passive waveguide layer 14, a taper coupling efficiency, $t$, was found to be $\geq .70\%$. In all of the TCLs measured, there was no indication of lasing perpendicular to the taper gradient. Furthermore, the tapers terminated cleanly without any evidence of ribbons of overgrowth beyond the taper section as was sometimes encountered before we developed the growth technique hereinafter described.

While the contact 20 of FIG. 1 extends over the passive region 14.1, current flow is mainly restricted to the active layer 16 due to the decreased potential barrier for injection into the heterojunction between layers 18 and 16 as compared to that between layers 18 and 14.

All of the TCLs did show a very high degree of polarization of the lasing radiation in TE modes except near the edges of the device. The presence of the tapers only slightly modified the degree of polarization as compared with that in the control lasers. The polarization observation, together with the above characterization experiments, clearly demonstrate an adequate taper growth control which permits small scale monolithic integration of optical waveguide components. This coupling method also allows isolation of the active region entirely away from outside surfaces, such as cleaved mirrors, thereby reducing contamination of the active region by the ambient.

We also measured the far field patterns for a TCL. For radiation emanating from the narrow active region 16 at surface 26 (where its thickness was about 0.5μm) the full half power angle for the radiation field was about 48°, whereas the corresponding value from the passive waveguide layer 14 at surface 24 (where its thickness was about 1.5μm), was about 29°. These values agreed quite well with estimates based on the guide dimensions and indices of refraction. The far field patterns were tested at several pumping levels up to currents corresponding to $2j_{th}$. No change in the shape of the patterns was observed over this large current density range. The mode selection mechanisms due to the thin active region 16 and passive waveguide layer 14 were therefore very effective. This experiment also demonstrated that mode conversion in zone 14.1 of the passive waveguide layer 14 is negligible as evidenced by the narrow half power radiation angle.

ALTERNATIVE STRUCTURES

Figure 2:
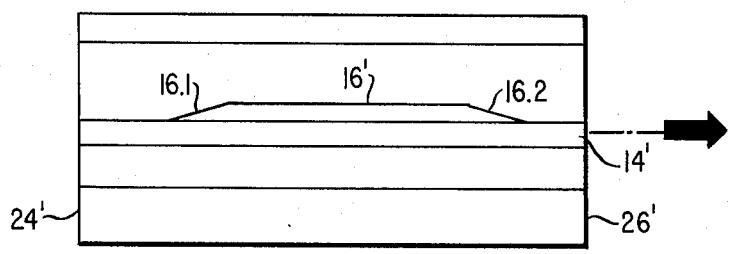
FIG. 2 is a schematic side view of a DH laser having two tapers in the active region in accordance with another embodiment of our invention.

As shown in FIG. 2, we also constructed a TCL in which the GaAs active layer 16' (about 0.5μm thick) had two tapers 16.1 and 16.2 so that layer 16' terminated short of both surfaces (mirrors) 24' and 26'. Radiation generated in active region 16' was coupled through both tapers into an $Al_{0.15}Ga_{0.85}As$ passive waveguide layer 14' which had a uniform thickness of about 0.5μm; i.e., zone 14.1 of FIG. 1 was omitted. The remaining layers were otherwise substantially identical to those of FIG. 1. This TCL lased with $j_{th} \sim 5$ kA/cm$^2$ and $\eta_d \sim 14\%$.

Figure 3:
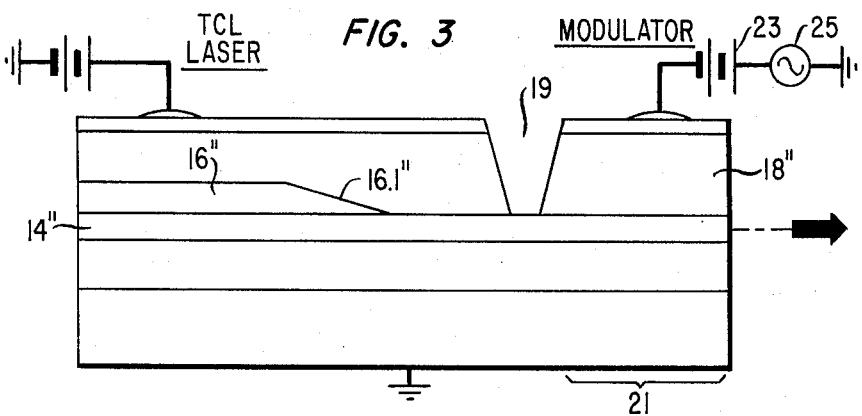
FIG. 3 is a schematic side view of a monolithic arrangement of a DH modulator and a DH laser in accordance with yet another embodiment of our invention.

To demonstrate that integrated circuits using TCLs can be readily fabricated, we constructed the monolithic laser-modulator combination shown in FIG. 3. The composition of the layers was substantially identical to those previously described. The GaAs active region 16'' of the TCL laser was about 0.5μm thick and had a single taper 16.1'' which terminated region 16'' interior to the structure. Al$_{0.15}$Ga$_{0.85}$As passive waveguide layer 14'' had a uniform thickness of about 0.5μm. Before forming metallic electric contacts, the second wide bandgap layer 18'', which comprised Al$_{0.22}$Ga$_{0.78}$As, was masked and then selectively etched with a solution of I$_2$ and KI dissolved in H$_2$O to form a V-shaped groove 19 which extended down to layer 18''. Groove 19 served to electrically isolate the TCL laser from portion 21 which, when reversed biased by battery 23, served to modulate the radiation coupled into passive waveguide layer 14''. Modulation was in accordance with information from source 25. The modulator was a modulator of the DH type described by F. K. Reinhart in U.S. Pat. No. 3,748,597 issued on July 24, 1973. Groove 19 may be filled with an electrical insulator such as an oxide, or instead of using etching initially isolation may be achieved by proton bombardment.

FABRICATION: LPE

Figure 4A:
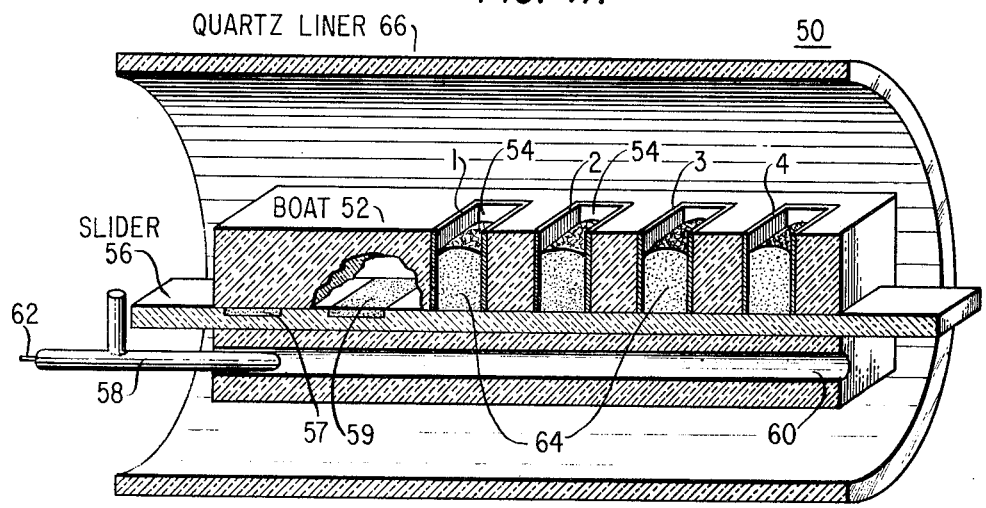
FIG. 4A is a cross-sectional, partially cut-away perspective view of LPE growth apparatus used to fabricate DH lasers.

The devices of FIGS. 1–3 were fabricated by liquid phase epitaxy (LPE) using conventional boat-slider apparatus 50 shown in FIG. 4A. The apparatus includes a carbon boat 52 having a plurality of wells 54 (four are shown for illustrative purposes only) which extend from the top of the boat into a channel in which a carbon slider 56 is slidably positioned. The slider, which forms the bottom of the wells, has a pair of recesses in its topmost surface into which a substrate 57 and a saturation seed 59 are placed. The spacing between the seed and substrate is equal to the spacing between adjacent wells, and the seed 59 precedes the substrate 57 under each well. The slider is moved from left to right by pushing a quartz rod 58 which is inserted into bore 60 extending along the bottom of boat 52. A thermocouple 62 is situated in rod 58 in order to measure the temperature of the boat.

Removable, thin walled (e.g., 0.5mm) carbon modules, which have no bottoms, snuggly fit into each well. Source solutions 64 are placed in the wells; i.e., inside the modules. The entire apparatus is situated in a quartz liner 66 which is located inside a furnace. A pure H$_2$ ambient is maintained in the liner.

In order to grow the layers of FIG. 1, for example, substrate 57 was (100) oriented n-type GaAs. Modules 1, 2 and 4 contained Al, Ga, As and dopants in suitable proportions to grow layers 12, 14 and 18 which comprised, respectively, n-Al$_{0.22}$Ga$_{0.78}$As, n-Al$_{0.15}$Ga$_{0.85}$As and p-Al$_{0.22}$Ga$_{0.78}$As. Module 3 contained Ga and As to grow the active region 16 of n-GaAs which was unintentionally doped. The layers were grown by heating the solutions to saturation and then sequentially sliding the substrate 57 under the solutions, while cooling the furnace from 850°C at a rate of 0.2°C/min. Note that dopants and excess GaAs were added to each source solution only after a preliminary bake-out at 800°C for 16 hours with access through a porthole (not shown) in the liner 66 so as not to reoxidize the baked-out Ga. Saturation at the bottom of the solutions was insured by saturation seed 59.

Figure 4B:
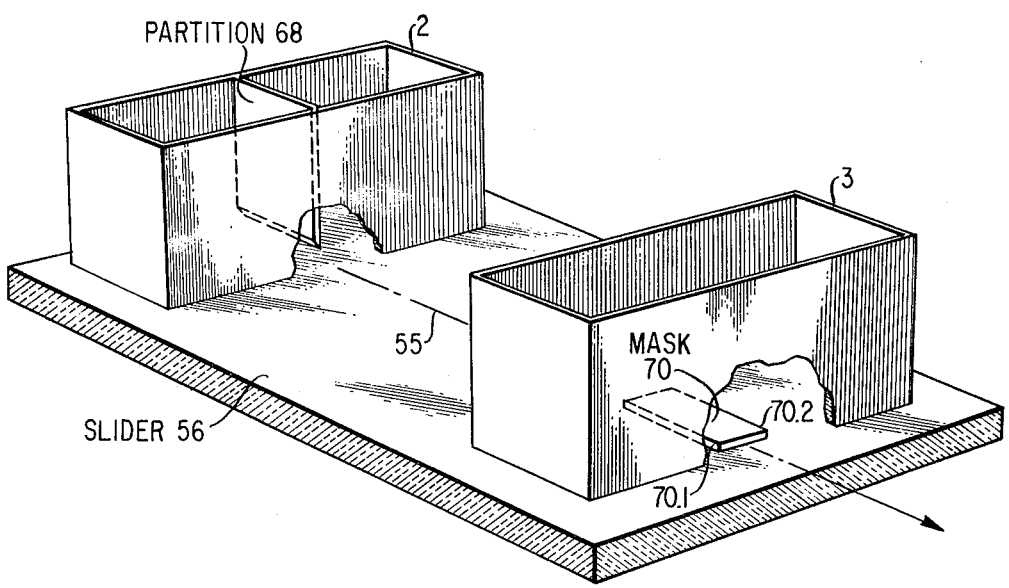
FIG. 4B is a partially cut-away perspective view of two modules used in the apparatus of FIG. 4A to fabricate the structure shown in FIG. 1 in accordance with another aspect of our invention.

In order to fabricate the zone 14.1 of passive waveguide layer 14 of FIG. 1, module 2 was modified in accordance with the teachings of Logan-Reinhart Case 24-5, supra. Briefly, as shown in FIG. 4B, module 2 included a carbon partition 68 which bifurcated the well. The partition 68, which was 100μm thick and tapered at its bottom to 25μm, was positioned so that a small clearance existed between its bottom and the top of the substrate. The growth rate under the partition is a function of the size of the clearance and decreased from about 35μm/°C at 30μm clearance to about 4μm/°C at 70μm clearance.

Identical solutions were placed on either side of partition 68 so that passive waveguide layer 14 had a uniform composition of Al$_{0.15}$Ga$_{0.85}$As. Since the carbon partition acts as a cooling fin, the growth rate directly under the partition is greater than that in adjacent areas, so that layer 14 as initially grown has two flat regions joined by a thicker zone in the shape of a symmetrical bump whose width is approximately equal to that of the partition. Note that the configuration of FIG. 1 shows only one of the flat zones 14.2 because the wafer was cleaved at the peak of the bump to form zone 14.1.

In accordance with another aspect of our invention, LPE growth of layers with smooth tapers, such as GaAs layer 16 of FIG. 1, was achieved by modifying module 3 to include a 1.1mm wide by 0.25mm thick sapphire mask 70 centered on the same axis 55 as the partition 68 of module 2. The substrate-to-mask clearance was 70μm. Mask 70 was held in place by indents (not shown) in the bottom of module 3. Two tapers result, one adjacent each edge 70.1 and 70.2 of mask 70. The layers which grow have a zone of uniform thickness and a taper adjacent to the mask which decreases smoothly to zero thickness over distances of 100 to 150μm, with the zero thickness points being adjacent edges 70.1 and 70.2. The tapers were separated by 1.1mm, approximately the width of the mask. Note once again that only one taper is shown in FIG. 1 because of the manner in which the wafer was cleaved.

We also found that use of a carbon mask instead of a sapphire mask was undesirable because the former introduced a thermal gradient which enhanced growth near the edges 70.1 and 70.2 and caused the layer (taper) to terminate in an abrupt mound rather than smoothly decreasing in thickness. In general, the material for the mask should have the following characteristics: inert to reaction with the source solutions, machinable or shapeable and of sufficiently low thermal conductivity so as not to cause appreciable local cooling of the melt so as to enhance local growth. Such materials include, for example, other oxides (quartz) and boron nitride.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular, the modular approach used in the layer growth thus permits a large variation of growth procedures that are useful for growing monolithic integrated optical devices without constructing an entirely new growth boat for each desired sequence of epitaxial layers. Moreover, the variation of the properties of one layer, obtained by using an appropriately designed module, does not influence the growth conditions of the adjacent layers. While the use of mask 70 permits growth of layer segments with tapered edges, this technique may also be used to leave an area of the waveguide exposed such as groove 19 of FIG. 3. The passive single heterostructure waveguide section thus formed could provide electrical isolation between adjacent devices and on the exposed waveguide one could perform various well known processing operations to construct components such as distributed Bragg reflectors, transmission filters, rib waveguides to enhance lateral passive waveguide mode control, and other devices whose operation does not require regrowth of cladding layers. The ability to independently control the divergence angle via zone 14.1 permits optimization of the coupling of the laser to optical fibers. Moreover, molecular beam epitaxy (MBE) can also be used to grow layers with tapers. Both LPE and MBE are generally suited to growth of layers of Group III ($a$) –V($a$) compounds, as is well known in the art.

FABRICATION: MBE

Extremely uniform and gradual tapers with high coupling efficiency have been made by MBE. The structure comprised a GaAs substrate on which three layers were grown: $Al_{0.3}Ga_{0.9}As$, $Al_{0.1}Ga_{0.9}As$ and GaAs. The GaAs layer was tapered. The two AlGaAs layers were grown by conventional MBE techniques described by Arthur (U.S. Pat. No. 3,615,931) and Cho (*J. Vac. Sc. and Tech*, Vol. 8, p S-31 (1971)). The substrate was held at about 600°C and growth rates were about 1μm/hour. Prior to starting growth of the GaAs layer, a 0.25mm thick knife-edged mask of tantalum was swung into place approximately 1.4mm above the surface of the substrate, masking a portion of it from the Ga and As sources located about 60mm from the mask. The GaAs layer then grew on the unmasked regions, terminated by linear tapers about 200μm wide which grew in the penumbra areas of the mask edges. These tapers were extremely smooth except for a 20μm wide strip near the zero-thickness edge of the taper. Optical transmission through this taper was about 84% near the GaAs bandgap ($\lambda$=0.93μm) and nearly 100% at 1.06μm using a laser source. Observations of the surface showed that the principal loss resulted from scattering out of the taper in the rough, 20μm-wide strip, which increases with decreasing wavelength.

To reduce the region of poor GaAs growth at the edge of the taper, a 6.1mm slit-shaped aperture was placed in front of the 9.5mm diameter Ga gun, limiting the source to a region of relatively uniform flux, and eliminating the interior gun walls, which produce a lower flux density. A Significant improvement was obtained. The profile as viewed in an interference microscope was noticeably more linear, the rough area was reduced to only a few μm, and the coupling efficiency increased to essentially 100% at all wavelengths. The tapers were also slightly shorter in length: about 160μm. The improved performance was attributed to a reduced area of slow growth ($\leq$ 0.1μm/hour) at the zero-thickness edge of the taper resulting from the gun aperture.

What is claimed is:

1. A double heterostructure optical device comprising:
    first and second wide bandgap layers,
    a narrower bandgap region intermediate to and contiguous with said first and second layers, and adapted for the propagation of radiation therein, characterized in that
    said region includes a passive optical waveguide layer having a bandgap less than that of said first and second layers and an active layer contiguous with said waveguide layer, said active layer having a bandgap less than that of said waveguide layer and terminating at one end within said device in a smooth taper effective to couple radiation from said active layer into said waveguide layer, said taper extending in the direction of radiation propagation.

2. The device of claim 1 including an output face from which radiation emanates, said waveguide layer including a zone adjacent said face which is of greater thickness than the remainder of said waveguide layer, the thickness of said zone decreasing gradually from said face toward the interior of said device.

3. The device of claim 1 wherein the other end of said active layer terminates in a second taper within said device, both of said tapers extending in the direction of radiation propagation but in directions opposite to one another.

4. The device of claim 1 wherein said first and second layers comprise $Al_xGa_{1-x}R$ and $Al_yGa_{1-y}R$, where R includes at least As, and $x > 0$, $y > 0$, said waveguide layer comprises $Al_zGa_{1-z}R$, $0 < z < x$ and $y$, and said active layer comprises $Al_rGa_{1-r}As$, $0 \leq r < z$.

5. The device of claim 4 wherein $r = 0$ and said active layer comprises GaAs.

6. The device of claim 4 wherein R includes P as well as As.

7. The device of claim 1 wherein said first and second layers have opposite conductivity types and said waveguide and active layers have the same conductivity type.

8. The device of claim 7 includes means for forward biasing said device and supplying current in excess of the lasing threshold of said active layer, thereby to generate laser radiation in said active layer.

* * * * *